United States Patent
Grossman et al.

(10) Patent No.: US 6,210,854 B1
(45) Date of Patent: Apr. 3, 2001

(54) AQUEOUS DEVELOPABLE FLEXOGRAPHIC PRINTING PLATE

(75) Inventors: Jan Grossman, Chapel Hill, NC (US); John Anthony Quinn, Morganville; David William Swatton, Redbank, both of NJ (US); Jose Antonio Briones, Bear, DE (US); Paul Thomas Shea, Freehold, NJ (US)

(73) Assignees: E. I. du Pont de Nemours and Company, Wilmington, DE (US); Reichhold Chemical, Research Triangle Park, NC (US)

( * ) Notice: Subject to any disclaimer, the term of this patent is extended or adjusted under 35 U.S.C. 154(b) by 0 days.

(21) Appl. No.: 08/113,147

(22) Filed: Aug. 27, 1993

(51) Int. Cl.[7] .............................. G03C 1/72; G03F 7/033; G03F 7/30

(52) U.S. Cl. .................. 430/138; 430/273.1; 430/286.1; 430/306; 522/110

(58) Field of Search ...................................... 430/281, 286, 430/138, 306, 910, 271, 273, 281.1, 286.1, 271.1, 273.1; 522/109, 110, 111

(56) References Cited

U.S. PATENT DOCUMENTS

| | | | |
|---|---|---|---|
| 4,726,877 | 2/1988 | Fryd et al. | 156/630 |
| 4,894,315 | * 1/1990 | Feinberg et al. | 430/281 |
| 4,956,252 | 9/1990 | Fryd et al. | 430/138 |
| 4,970,037 | 11/1990 | Kafka et al. | 264/101 |
| 5,073,477 | 12/1991 | Kusuda et al. | 430/287 |
| 5,075,192 | 12/1991 | Fryd et al. | 430/138 |
| 5,077,175 | * 12/1991 | Fyrd et al. | 430/271 |
| 5,143,819 | 9/1992 | Mirle et al. | 430/286 |
| 5,175,076 | 12/1992 | Ishikawa et al. | 430/281 |
| 5,362,604 | 11/1994 | Yatsuyanagi | 430/281 |
| 5,707,773 | * 1/1998 | Grossman et al. | 430/138 |

FOREIGN PATENT DOCUMENTS

| | | | |
|---|---|---|---|
| 0 230 936 A3 | 8/1987 | (EP) | G03C/1/68 |
| 0 356 953 A2 | 3/1990 | (EP) | G03F/7/00 |
| 0 489 553 A1 | 6/1992 | (EP) . | |
| 0 513 493 A1 | 11/1992 | (EP) . | |

OTHER PUBLICATIONS

Derwent abstract of Japanese Patent Kokai 5–32743 (Pub 2/93) Accession No: 93–088701/199311.
Derwent abstract of Japanese Patent 5045874 (Pub 2/93) Accession No: 93–105140/199313.
Derwent abstract of Japanese Patent 5178946 (Pub. 7/93) Accession No: 93–261690/199333.
Derwent abstract of Japanese Patent 6–51511 (Pub 2/1994) Accession No: 93–076715/199309.
Japanese Patent Kokai Derwent abstract of Japanese Patent 6–194833 (Pub 7/1994) Accession No: 94–267055/199433.

* cited by examiner

Primary Examiner—Janis L. Dote
(74) Attorney, Agent, or Firm—Thomas H. Magee

(57) ABSTRACT

An aqueous developable photosensitive element comprising a support and a photosensitive layer provided thereon, said layer containing (a) an elastomeric microgel binder having an elastomeric core which can be crosslinked and a thermoplastic noncrosslinked shell, (b) an initiator, (c) an ethylenically unsaturated monomer or oligomer and optionally (d) a basic compound capable of neutralizing the acidic functionality and method of use to make an aqueous developable flexographic printing plate is described.

17 Claims, No Drawings

AQUEOUS DEVELOPABLE FLEXOGRAPHIC PRINTING PLATE

FIELD OF THE INVENTION

This invention relates to solid photosensitive elements which can be used to make flexographic printing plates. More particularly, it relates to aqueous developable photosensitive elements and to a process for preparing such elements.

BACKGROUND OF THE INVENTION

Photosensitive compositions useful in preparing flexographic printing plates are well known in the art. These compositions generally comprise (1) an addition polymerizable, non-gaseous, ethylenically unsaturated monomer or oligomer, (2) a photoinitiator or photoinitiating system activated by actinic radiation and (3) a thermoplastic elastomeric polymeric binder comprising polymerized conjugated diene monomers. Flexographic printing elements can be made from these photosensitive compositions by solvent casting, by extruding and calendering, or by pressing the compositions at an elevated temperature into the form of a layer or self-supporting sheet on a suitable casting wheel, belt or platen. The photosensitive sheet can be permanently affixed to a suitable permanent substrate. A removable coversheet is usually placed on top to protect the surface of the photosensitive sheet from contamination by dirt and dust particles during storage prior to use.

Photopolymerizable elements and processes for their use in preparing flexographic printing plates are well known in the art. See, for example, U.S. Pat. Nos. 4,323,636; 4,460,675; 4,970,037; and many others.

Flexographic printing plates can be made from the photosensitive elements described above, by exposing to actinic radiation selected portions of the photosensitive layer, usually through an image-bearing transparency. Upon exposure to actinic radiation, the ethylenically unsaturated monomer or oligomer is polymerized or crosslinked in those areas of the photosensitive layer exposed to actinic radiation, resulting in reduced solubility or swellability in developer solvents. No significant polymerization or crosslinking occurs in the unexposed areas of the photosensitive layer. Consequently, upon application of suitable developer solvent, the exposed areas remain, and the unexposed areas are removed.

The developer solvents most commonly used are organic solvents including aromatic or aliphatic hydrocarbon or halohydrocarbon solvents. Recently, it has become less desirable to use such organic solvents due to toxicity and environmental concerns. Thus, photosensitive compositions which are aqueous developable, i.e., can be washed out with aqueous solutions or plain water, have been proposed for use in preparing flexographic printing plates. Some examples include U.S. Pat. Nos. 4,177,074; 4,361,640; and 4,960,073.

Developability in aqueous alkali solutions can be achieved by using acid-containing copolymers. Developability in plain water can be achieved by using acid-containing copolymers that have been neutralized by the addition of organic or inorganic bases. For example, Mirle et al., U.S. Pat. No. 5,143,819, disclose a method of making an aqueous developable photocurable composition by reacting an acid-modified polybutadiene copolymer with a nitrogen-containing compound having a polymerizable ethylenically unsaturated group. The composition is then used to make an aqueous developable flexographic printing plate.

Aqueous developability can also be achieved using a photosensitive composition in which the binder is a core shell microgel as described by Fryd et al. in U.S. Pat. No. 5,075,192. The core shell microgel binder described by Fryd et al. is prepared in a two-step process whereby an elastomeric core is first formed and then grafted to an acid-modified copolymer. However, such microgel binders sometimes have excessive crosslinking of the elastomeric core which can degrade the elastomeric properties and/or cause processing difficulties.

Accordingly, there is a need for an improved aqueous developable photosensitive element which can be used to prepare a flexographic printing plate.

SUMMARY OF THE INVENTION

The present invention describes an aqueous developable photosensitive element suitable for the production of a flexographic printing plate. The element comprises a support, a layer of a solid photosensitive composition, and an optional coversheet. The photosensitive composition comprises:

(a) an elastomeric microgel binder having a core comprising a homopolymer or copolymer of an elastomeric monomer and a shell comprising a copolymer of the elastomeric monomer and a monomer having acidic functionality;

(b) at least one ethylenically unsaturated monomer or oligomer; and (c) a photoinitiator system.

The invention further describes a process for preparing an aqueous developable photosensitive element, said process comprising:

(a) polymerizing an elastomeric monomer as a latex dispersion to form an elastomeric core, wherein at least 10% of the elastomeric monomer is unpolymerized;

(b) copolymerizing the unpolymerized elastomeric monomer with an ethylenically unsaturated monomer or oligomer having acidic functionality to form a shell over the elastomeric core;

(c) substantially removing the water;

(d) mixing the binder with (i) at least one ethylenically unsaturated monomer or oligomer, and (ii) a photoinitiator system; and (e) applying the mixture from step (d) to a support to form a layer.

Optionally, a basic compound can be added after step (b) or step (c) or during step (d). In a preferred embodiment, the optional basic compound is present and is a nitrogen-containing compound having at least one ethylenically unsaturated group.

Optionally, the water can be removed in step (c) by a dewatering extruder as described in Kafka et al., U.S. Pat. No. 4,970,037. If a dewatering extruder is used, it is preferred that step (d) is carried out after step (b) and step (c) is carried out after step (d).

DETAILED DESCRIPTION OF THE INVENTION

This invention relates to a photosensitive element comprising (a) a photosensitive layer which is aqueous developable; (b) a support; and (c) an optional coversheet. By the term, "aqueous developable" it is meant that the elastomeric microgel binder alone is soluble, swellable or dispersible in a water-based developer solution. The developer solution can be a basic water solution, detergent solution, or, preferably, water alone.

The photosensitive layer comprises (a) an elastomeric microgel binder having a core comprising a homopolymer or copolymer of an elastomeric monomer and a shell comprising a copolymer of the elastomeric monomer and a monomer having acidic functionality; (b) at least one ethylenically unsaturated monomer or oligomer;(c) a photoinitiator system; and (d) optionally, a basic compound wherein said basic compound is present in an amount sufficient to neutralize a substantial portion of the acidic functionality of the microgel binder.

I. Photosensitive Element
1. Photosensitive Layer
A. Binder

The binder in the photosensitive layer imparts the bulk properties to the final flexographic printing plate. Thus it should be elastomeric and result in plates with sufficient resilience, flexibility or limpness, toughness, ink solvent resistance, and with good ink transfer. Such desirable properties are well known in the flexographic art area.

Binders suitable for practicing the present invention are core shell microgels having a thermoplastic elastomeric core, which can be crosslinked, and a thermoplastic non-crosslinked shell. The core provides the elastic properties of the binder while the shell confers aqueous developability.

The core comprises a homopolymer or copolymer of an elastomeric monomer and the shell comprises a copolymer of the elastomeric monomer and an ethylenically unsaturated monomer or oligomer having acidic functionality.

As used herein, the term "elastomeric monomer" means an ethylenically unsaturated monomer which forms a homopolymer having a glass transition temperature of 10° C. or less. Suitable elastomeric monomers include butadiene, isoprene, neoprene, urethanes, and mixtures thereof. The elastomeric microgel binder core can comprise an elastomer selected from the group consisting of poly (butadiene), poly(isoprene), poly(butadiene-styrene), poly (isoprene-styrene), neoprene, polyurethanes and mixtures thereof. A preferred elastomeric monomer is butadiene.

The monomers which can be copolymerized with the elastomeric monomer to form the core ("core comonomers") are those which form copolymers with elastic properties similar to homopolymers of the elastomeric monomer. In general, core comonomers are added to improve the toughness or durability of the core or to aid in the emulsion polymerization process. In most cases, the core comonomer will not have additional functional groups, i.e., acidic functionality. Examples of suitable core comonomers include polymerizing alkenyl aromatic hydrocarbons, especially vinyl monocyclic aromatic hydrocarbons such as styrene and alpha-methyl styrene. The amount of core comonomer present in the core copolymer should be less than 20% by weight based on the weight of the copolymer, preferably less than 10% by weight.

Suitable monomers for copolymerizing with the elastomeric monomer to form the microgel shell are those having (1) at least one ethylenically unsaturated group capable of copolymerizing with the elastomeric monomer and (2) at least one acidic functional group. The acidic group is preferably a carboxylic acid, but sulfonic acid and other acidic groups can be used. Examples of suitable monomers ("acidic monomers") include acrylic and methacrylic acids, crotonic and isocrotonic acids, sorbic acid, maleic acid, cinnamic acid, fumaric acid, itaconic acid and the like. Mixtures of acidic monomers can also be used. Acrylic and methacrylic acids are preferred.

When the core is a copolymer there may be some core comonomer remaining when the acidic monomer is added to form the shell. Thus, the shell can contain some amount of a terpolymer of elastomeric monomer/core comonomer/acidic monomer. However, the amount of such a terpolymer will be very small, if any, since the amount of core comonomer is small relative to the elastomeric monomer. Almost all of the core comonomer will be in the core. In the discussion which follows, the microgel shell will be referred to as a copolymer of the elastomeric monomer and acidic monomer (or mixture of acidic monomers) although it will be understood that some small amount of core comonomer may polymerize in the shell.

The amount of acidic monomer copolymerized with the elastomeric monomer should be enough to confer aqueous processibility to the microgel binder, but beyond that it should be minimized. That is, the ratio of acidic shell copolymer to elastomeric core homopolymer or copolymers should be as small as possible while maintaining aqueous processibility. This maximizes the amount of elastomeric polymer in the microgel and thus optimizes the elastic properties of the microgel binder. As discussed above, it is preferred that no more than 95% of the elastomeric monomer is polymerized in the core, most preferably 60 to 90%.

A preferred core shell microgel is one that has a core comprising a copolymer of styrene and butadiene wherein the styrene content is less than 10% and a shell comprising a copolymer of butadiene with an ethylenically unsaturated monomer or oligomer having acidic functionality. A more preferred core shell microgel is one that has a core comprising a copolymer of styrene and butadiene wherein the styrene content is less than 10% and a shell comprising a copolymer of butadiene with acrylic acid or methacrylic acid. Also preferred is a core of polybutadiene and a shell comprising a copolymer of butadiene and acrylic acid or methacrylic acid.

The term "microgel", as used herein, includes crosslinked spherical polymer molecules with a particle size of 0.01 to 1.0 micron in diameter prepared by emulsion polymerization. It is most desirable to use a microgel having a very thin shell. Thus the binder has large domains of essentially pure elastomeric polymer and will have very similar elastic properties to that polymer. When a basic compound is added to the microgel to neutralize the acidic functionality, the photosensitive material can be processed in tap water.

For the following discussion, butadiene will be used as an example of an elastomeric monomer. However, it is understood that other elastomeric monomers can be used.

To prepare the core shell microgel, the core butadiene homopolymer or copolymer, is first formed as a latex dispersion by emulsion polymerization. Emulsion polymerization generally refers to polymerization in an aqueous system in which a monomer such as butadiene or a mixture of butadiene and a core comonomer, is present in a dispersed second phase, resulting in polymer as a dispersed solid phase. The solid elastomeric polymer dispersion in aqueous solution is variously referred to as a rubber latex, elastomer latex, colloidal elastomer, or microgel dispersion. Very small polymer particles are produced and are typically submicron in size. Emulsion polymerization techniques are well known to those skilled in the art and discussions can be found in *Emulsion Polymerization*, I. Piirma and J. L. Gardon, eds., ACS Symposium Series, Vol. 24 (Washington, D.C., 1976); and *Emulsion Polymers and Emulsion Polymerization*, D. R. Bassett and A. E. Hamielic, eds., ACS Symposium Series, Vol. 165 (Washington, D.C., 1981).

In general, the procedure to form the elastomeric polymer latex involves the formation of an oil/water emulsion which contains the polymerization catalyst and usually an emulsifying agent to stabilize the emulsion. The term "oil" as used herein refers to a liquid which is substantially immiscible with water and forms a second phase. Such liquids are well known in this art area, e.g., ISOPAR. The catalyst can be present in either the oil or water phase. A small amount of crosslinking agent, such as allyl methacrylate, can also be present. However, the amount of crosslinking in the butadiene homopolymer or copolymer should be fairly low, i.e., less than about 10% crosslinked. Excessive crosslinking in the core can degrade the elastomeric properties of the microgel. Other materials which can be present in the emulsion are discussed in the references above.

After the emulsion is stabilized, the butadiene monomer is added to the emulsion and polymerization is initiated. Usually this is accomplished by the application of heat, typically 50° to 70° C.

The core comonomer can be added to the stabilized emulsion before the elastomeric monomer is added or at the same time.

For the microgel binders used in practicing the invention, the butadiene is only partially polymerized at this point. It is preferred that less than about 95% by weight of the butadiene monomer is polymerized, more preferably 60 to 90% is polymerized. At this point, a monomer having acid functionality is added to the reacting mixture. This monomer polymerizes with the remaining butadiene monomer to form a thin shell on the polybutadiene core.

The thus-formed elastomeric latex with core shell microgel particles can be used as a latex to form the photosensitive layer by mixing with the other components of the photosensitive composition and using a device such as a dewatering extruder, as described in Kafka et al., U.S. Pat. No. 4,970,037. However, the liquid (i.e., water and the oil) can be removed from the latex to produce a solid binder prior to mixing with the other components. This can be done by dewatering extrusion or other well-known techniques of coagulation, filtration, washing and drying. Freeze drying and spray drying are also useful methods for practicing the present invention.

In addition to the core shell microgel binder, there can also be one or more additional macromolecular polymeric binders. These can be added to improve the mechanical properties of the final flexographic printing plate, e.g., toughness, but should not deleteriously affect the desired elastic properties. The additional macromolecular polymeric binder may contain sufficient acidic or other groups so that the binder is also processable in an aqueous developer. Useful aqueous-processible binders have been disclosed in, e.g., U.S. Pat. Nos. 3,458,311; 4,273,857; and 4,293,635. Examples include acid-containing polymers or their salts; and amphoteric polymers such as interpolymers derived from N-alkylacrylamides or methacrylamides, acidic film-forming comonomers, and an alkyl or hydroxyalkyl acrylate.

In general, the core shell microgel binder or mixture of core shell microgel binder and macromolecular polymeric binder will be present in an amount of about 40–95% by weight, based on the total weight of the photosensitive layer; preferably 70–90% by weight.

For the discussion which follows, the term "binder" is intended to encompass a single core shell microgel binder, a mixture of core shell microgel binders, or a mixture of one or more core shell microgel binders with one or more macromolecular polymeric binders.

B. Basic Compound

The basic compound is optional and is added when it is desired to develop the photosensitive element with plain tap water. The basic compound neutralizes the acidic functionality of the microgel shell and thus allows the microgel binder to be developable in plain water. The basic compound can be an inorganic base or a basic organic compound such as an amine. Examples of suitable inorganic bases include the hydroxides of the Group IA and IIA metals. Examples of suitable organic bases include primary, secondary and tertiary amines such as alkyl or aryl amines having 2 to 12 carbon atoms, alkyl or aryl di- or triamines having 2 to 12 carbon atoms, alkanol amines, aminodiols, and the like.

A preferred basic compound is a nitrogen-containing compound having at least one ethylenically unsaturated group. Photosensitive compositions in which these types of basic compounds are present result in flexographic printing plates with improved resistance to aqueous based inks. Particularly suitable are those compounds which contain both an amino group and a (meth)acrylate, (meth)acrylamide or (meth)acryloylcarbamate group. Examples of suitable compounds include dialkylaminoalkyl acrylates and methacrylates, dialkylaminoalkyl acrylamides and methacrylamides, and dialkylaminoalkyl acryloylcarbamates and methacryloylcarbamates, where the alkyl groups independently have from 1 to 6 carbon atoms, such as diethylaminoethyl acrylate, diethylaminoethyl methacrylate, dimethylaminopropyl acrylamide, and dimethylaminopropyl methacrylamide. Mixtures thereof can also be used.

The basic compound can be added at almost any time during the preparation of the photosensitive element, i.e., the compound can be added (a) immediately after the formation of the microgel in the latex, (b) after the microgel binder has been separated from the water in the latex, or (c) with the addition of the other components of the photosensitive layer.

The amount of basic compound added should be sufficient to neutralize the acidic functionality to the extent that the photosensitive composition is water soluble. The molar ratio of basic compound added to acidic monomer in the copolymer shell is usually in the range of 1:2 to 2:1. In general, the basic compound is present in an amount of about 1 to 15% by weight, based on the total weight of the photosensitive layer.

C. Monomer

For the discussion which follows, the term "monomer" is intended to encompass both monomers, oligomers and mixtures thereof.

Monomers which are suitable in the photosensitive layer are addition-polymerizable ethylenically unsaturated compounds having relatively low molecular weights. The photosensitive layer can contain a single monomer or a mixture of monomers. These must be compatible with the binder to the extent that the resolution of the photosensitive layer is not impaired. In general, monomers which mix with the binder to form a layer which is clear and non-cloudy can be used.

Monomers which can be used in photosensitive elements which are used to form flexographic printing plates are well known in the art. Examples of such monomers can be found in Chen, U.S. Pat. No. 4,323,636; Fryd et al., U.S. Pat. No. 4,753,865; Fryd et al., U.S. Pat. No. 4,726,877; and Feinberg et al., U.S. Pat. No. 4,894,315. Preferred monomers include the acrylate and methacrylate mono- and poly-esters of alcohols and polyols such as alkyl alcohols, hexamethylene glycol, trimethylol propane, ethoxylated trimethylol propane, pentaerythritol, dipentaerythritol, and the like.

The monomer or mixture of monomers is generally present in an amount of 5–50% by weight, based on the weight of the photosensitive layer; preferably 5–30% by weight.

D. Photoinitiator System

The photoinitiator system is an organic compound or group of compounds which is radiation sensitive, free-radical generating, and which initiates polymerization of the monomer or monomers without excessive termination. It should be activatable by actinic radiation and, preferably, thermally inactive at and below 185° C. Initiators which are useful in photosensitive elements which are used to form flexographic printing plates are well known in the art. Suitable examples include the substituted and unsubstituted polynuclear quinones, aromatic ketones, benzoin and benzoin ethers, and 2,4,5-triarylimidazolyl dimers. Further discussion of suitable initiators can be found in Gruetzmacher et al., U.S. Pat. No. 4,460,675 and Feinberg et al., U.S. Pat. No. 4,894,315.

The initiator is generally present in an amount of about 0.01–15% by weight, based on the total weight of the photosensitive layer; preferably 0.1–5.0% by weight.

E. Optional Components

The photosensitive layer can also contain other additives depending on the final properties desired. As with the other components, the additives must be compatible with the binder to the extent that the resolution of the photosensitive layer is not impaired. In general, additives which mix with the binder to form a layer which is clear and non-cloudy can be used. Such additives include plasticizers, thermal polymerization inhibitors, antioxidants, antiozonants, colorants, U.V. absorbers, fillers or reinforcing agents.

The additives generally constitute less than 20% by weight, based on the total weight of the photosensitive layer; preferably less than 10% by weight.

The photosensitive layer can be made up of a single layer or a multiplicity of layers having the same composition, or it can be made up of two or more layers having different compositions. In general, the different layers should have binders which are the same or similar, but may differ in the concentrations of components, the types of monomers and initiators, and the additives.

2. Support

Materials which are suitable for use as a support in a photosensitive element which is used to prepare a flexographic printing plate are well known in the art. The support can be clear and transparent or opaque. Examples of suitable support materials include metals, e.g., steel and aluminum plates, sheets and foils; and films or plates composed of various film-forming synthetic resins or polymers, such as the additional polymers or linear condensation polymers. Preferred support materials are polyester films, such as polyethylene terephthalate.

The support generally has a thickness of from about 25 to 250 micrometers (1 to 10 mils).

3. Optional Coversheet

A transparent coversheet such as thin film of polyethylene terephthalate, polypropylene or other strippable material can be used as a cover element to prevent contamination of or damage to the photosensitive layer during storage or manipulation. It covers the surface of the photosensitive layer opposite the support.

The coversheet can also include a thin, aqueous-developable release layer which is positioned between the coversheet and the photosensitive layer. The release layer provides a smooth flexible surface which allows easy release of the negative transparency that is used for imaging. It can also improve contact or alignment of the transparency with the photosensitive layer.

The release layer should be aqueous-developable so that it is completely removed in the development step, in both the exposed and unexposed areas. Examples of suitable materials which can be used include polyvinyl alcohol, polyvinyl acetate, water-soluble polyamides, and hydroxyalkyl celluloses. The release layer generally has a thickness in the range of 2 to 25 micrometers (0.1 to 1.0 mils).

Multilayered coversheets, such as those described in U.S. Pat. Nos. 4,427,759 and 4,460,675 to Gruetzmacher et al. for solvent developable systems, may also be used so long as the binders used are aqueous developable.

II. Preparation of Element and Printing Plate

1. Photosensitive Element

The photosensitive elements of this invention can be made by a wide variety of techniques which are known in the flexographic art, in which the components of the photosensitive layer are mixed, formed into a sheet structure, and applied to a support. It is preferred that the photosensitive element be made by mixing all of the components and forming the photosensitive mixture into a hot melt. This can be carried out by placing the mixture in a mixing device such as a rubber mill which can be part of a calender device. Alternatively, the mixture can be placed in an extruder which performs the function of melting, mixing, deaerating and filtering the composition. A twin screw extruder or other extruders known to those skilled in the art can be used. The temperature of the melt in the extruder is within the range of about 1000 to 200° C., and the composition remains in the extruder for about 0.5 to 5 minutes.

Alternatively, the photosensitive material can be placed between the support and a coversheet in a mold. In some cases there will be a layer of adhesive between the support and the photosensitive layer. The support can be coated with an adhesive prior to the molding step and the photosensitive material placed on the adhesive side, or a layer of adhesive film can be placed between the support and the photosensitive material. The layers of material are then pressed flat by the application of heat and/or pressure. The coversheet can be any of the materials discussed above. The photosensitive material can also be pressed between two removable support materials. An assembly of support, photosensitive layer and coversheet can then be laminated together, with an adhesive layer, if necessary.

2. Flexographic Printing Plate

In general, the process of preparing a flexographic printing plate from a photosensitive element includes the steps of optional back exposure through the support, main image exposure, development or washout, and optional post-development treatment. Post-development treatment can include any or all of the following: drying, overall post-exposure, and surface detackification.

Back exposure can take place if the support is substantially transparent to actinic radiation. The back exposure gives the photosensitive layer a uniform and relatively short exposure through the support, thereby photopolymerizing or photocrosslinking the monomer in the support region to produce a floor. This serves to sensitize the plate and establish the depth of the plate relief. The back exposure generally uses a radiation source the same as or similar to that used for the main imagewise exposure, as discussed below.

The next step is to expose to actinic radiation selected portions of the photosensitive layer through an image-bearing transparency. The ethylenically unsaturated monomer or oligomer is polymerized or crosslinked, and may crosslink with the binder, in those areas exposed to actinic radiation resulting in reduced solubility or swellability in aqueous developer solutions. No significant polymerization or crosslinking takes place in the unexposed areas of the layer. The image-bearing transparency can be constructed of any suitable material including cellulose acetate film and oriented polyester film.

Actinic radiation from any source and of any type can be used in the exposure step. The radiation can emanate from point sources or be in the form of parallel rays or divergent beams. The free-radical generating systems activatable by actinic radiation most frequently used generally exhibit their maximum sensitivity in the ultraviolet range. Therefore, the radiation source should furnish an effective amount of this radiation, preferably having a wavelength range between about 250 nm and 500 nm, more preferably 300 to 420 nm. In addition to sunlight, suitable radiation sources include carbon arcs, mercury-vapor arcs, fluorescent lamps, lasers, electron flash units and photographic flood lamps. Electron accelerators and electron beam sources through an appropriate mask can also be used. The most suitable sources of radiation are the mercury-vapor lamps, particularly the sun lamps, and fluorescent lamps.

The radiation exposure time can vary from fractions of a second to minutes, depending upon the intensity and spectral energy distribution of the radiation, its distance from the photosensitive element, and the nature and amount of the photosensitive composition. Typically, a mercury vapor arc is used at a distance of about 1.5 to about 60 inches (3.8 to 153 cm) from the photosensitive element. Exposure temperatures are preferably ambient or slightly higher, i.e., about 20 to about 35° C.

Following imagewise exposure, the image can be developed by washing with a suitable aqueous developer. The aqueous developer can contain alkaline materials such as alkali metal hydroxides or it can be an aqueous detergent solution. However, it is preferred to use water alone. The aqueous developer can be heated up to about 50° C.

Development time can vary, but it is preferably in the range of about 5 to 25 minutes. The aqueous developer can be applied in any convenient manner, including immersion, spraying and brush or roller applications. Brushing aids can be used to remove the unpolymerized or non-crosslinked portions of the composition. Development can also be carried out in an automatic processing unit which uses liquid and mechanical brushing action to remove the unexposed portions of the element.

Following aqueous development, the relief printing plates are generally blotted or wiped dry, and then dried in a forced air or infrared oven. Drying times and temperatures may vary, however, typically the plate is dried for 5 to 30 minutes at 60° C. High temperatures are not recommended because the support can shrink, leading to registration problems.

Most flexographic printing plates are uniformly post-exposed to ensure that the photopolymerization and photo-crosslinking process is complete and that the plate will remain stable during printing and storage. This "post-exposure" step utilizes the same actinic radiation sources as the main exposure.

Detackification is an optional post-development treatment which can be applied if the surface is still tacky. This can be accomplished by exposure to radiation sources having a wavelength in the range of 200 to 300 nm, as described in European Patent 0 017927. It may be advantageous to treat the plate with an aprotic solvent prior to exposing to light having wavelengths in the range of 200 to 300 nm, as described in Gibson, U.S. Pat. No. 4,806,506.

The imaging and light finishing exposures can also be carried out using a high intensity radiation source, such as a Fusion lamp or Western Quartz lamp.

The following examples serve to illustrate the practice of the invention. All percentages, ratios and parts are by weight unless otherwise indicated.

EXAMPLES

| GLOSSARY | |
|---|---|
| AA | Acrylic acid |
| Base 1 | Diethylaminoethyl methacrylate |
| Base 2 | N-Dimethylaminopropyl methacrylamide |
| Base 3 | Triethanolamine |
| Base 4 | Diethylaminopropanediol |
| Base 5 | 10% aqueous NaOH |
| Base 6 | 10% aqueous KOH |
| BD | Butadiene |
| BHT | Butylated hydroxytoluene |
| Blue 3R-RF | Mixture of 90% MACROLEX ® BLUE RR, CI Solvent Blue 97, and 10% MACROLEX ® VIOLET B, CI Solvent Violet 13, both from Mobay Chemical (Union, NJ) |
| CP-1216 | Latex of 2.8 parts of poly(vinylidene chloride/itaconic acid/methyl acrylate) and one part poly(ethyl acrylate) |
| DAM | Diallyl Maleate, MTM - Hardwicke, Inc. (Elgin, SC) |
| DDM | Dodecyl mercaptan |
| t-DDA | Tertiary dodecyl mercaptan |
| EC 9630 | Aqueous black ink EC 9630 DENSE BLACK, pH 9.0, Zahn #2 viscosity 27 seconds, from Environmental Inks & Coatings, (Morganton, NC) |
| HEC | hydroxyethyl cellulose, HEC WP-09-L from Union Carbide (Danbury, CT) |
| HMDA | 1,6-hexanediol diacrylate |
| HMDMA | 1,6-hexanediol dimethacrylate |
| HPC | hydroxypropyl cellulose, KLUCEL ® E-F, from Hercules, Inc. (Wilmington, DE) |
| Initiator | 2-Phenyl-2,2-dimethoxyacetophenone |
| Inhibitor | 2,3-diazabicyclo[3.2.2]non-2-ene, 1,4,4-trimethyl-N,N'-dioxide CAS No. 34122-40-2 |
| ISOPAR V | $C_{14-18}$ isoparaffinic hydrocarbons, CAS No. 64742-46-7, from Exxon Co. (Houston, TX) |
| LOMAR PW | Naphthalene sulfonic acid formaldehyde polymer, sodium salt, CAS No. 9084-06-4, from Henkel Corp. (Minneapolis, MN) |
| MAA | Methacrylic acid |
| NaDDBS | Sodium dodecyl benzene sulfonate |
| NLA | n-Lauryl acrylate |
| 76RES-P546 | Vinylidene chloride/acrylate copolymer latex, from UNOCAL Chemicals (Schaumburg, IL) |
| TBP | Tributoxyethyl phosphate |
| TKPP | Tetrapotassium pyrophosphate Monsanto Company (St. Louis, MO) |
| UV absorber | 2-[3',5'-bis(1-methyl-1-phenylethyl)-2'-hydroxyphenyl]-benzotriazole |
| VAZO ® 67 | 2,2'-Azo-bis (2-methylbutyro-nitrile), from E. I. du Pont de Nemours and Company, (Wilmington, DE) |

Example 1

This example illustrates the preparation of a core/shell microgel binder used in the present invention.

A. Preparation of Water Phase Solution

The water phase solution was composed of the following components:

| Component | Amount (grams) |
| --- | --- |
| LOMAR PW | 56 |
| NaDDBS | 239 |
| Deionized water | 13093 |

NaDDBS and Lomar PW were charged to the water under a nitrogen blanket. The components were mixed until they were dissolved.

B. Preparation of Oil Phase

The oil phase solution was composed of the following components:

| Component | Amount (grams) |
| --- | --- |
| Styrene | 1332 |
| DDM | 56 |
| VAZO ® 67 | 35 |
| ISOPAR V | 2244 |
| DAM | 140 |

The DDM and DAM were dissolved in styrene under a nitrogen blanket. The VAZO® 67 was then added and allowed to dissolve. The ISOPAR V was slowly added to the styrene solution while under a nitrogen blanket.

C. Preparation of Oil Emulsion

The oil phase was added to the water phase, under a nitrogen blanket, keeping the solution mixed. This was then homogenized using a MICROFLUIDIZER® M210 (Microfluidics Corp., Newton Mass .) at 3000–6000 psig until the particle size measured 100–250 nm (Gaussion distribution NiComp Submicron Particle Size Analyzer, Model 270, Pacific Scientific).

D. Butadiene Polymerization

The following composition was used for the polymerization:

| Component | Amount |
| --- | --- |
| Deionized water | 79.00 pounds |
| Oil emulsion | 52.00 pounds |
| FeSO$_4$ | 0.02 grams |
| TKPP | 33.00 grams |
| BD | 43.18 pounds |

The FeSO$_4$ and TKPP were dissolved in the deionized water under a nitrogen atmosphere. The oil emulsion was added and this was placed in an autoclave. The BD was added and allowed to swell the oil emulsion droplets for one hour while stirring. The temperature was then raised to 60–65° C. to initiate the polymerization reaction. Polymerization was allowed to proceed until approximately 85% of the BD had polymerized.

The following ingredients were premixed and pumped in at approximately 85% conversion of the BD.

| Component | Amount |
| --- | --- |
| MAA | 2.27 pounds |
| t-DDM | 0.65 pounds |
| NaDDBS | 0.31 pounds |
| Deionized Water | 22.47 pounds |

The reaction proceeded to completion with approximately 90–95% total conversion. The resulting polymer Mooney viscosity was 65. The final particle size was 144 nm. (Gaussion distribution NiCOMP Submicron Particle Size Analyzer, Model 270 Pacific Scientific).

The above emulsion was freeze dried to remove the water. The result was a solid microgel binder having a core of poly(butadiene/styrene) and a shell of poly(butadiene/methacrylic acid). The percent MAA present was 3.9%.

Example 2

This example illustrates the formation of a photosensitive element using the microgel binder from Example 1.

A photosensitive composition was prepared from the following components:

| Component | Parts by Weight |
| --- | --- |
| Microgel binder | 71.4 |
| HMDA | 5.0 |
| NLA | 5.0 |
| Base 1 | 10.0 |
| TBP | 5.0 |
| Initiator | 3.0 |
| BHT | 0.5 |
| Inhibitor | 0.1 |

A coversheet was prepared by coating a 5 mil (0.013 cm) sheet of polyethylene terephthalate with a layer of a blend of one part HEC and one part HPC at a 2 coating weight of 20 mg/dm$^2$.

A support was prepared by coating a support sheet of 7 mil (0.018 cm) CRONAR® polyethylene terephthalate, which contained 0.24% UV absorber and 0.57% Blue 3R-RF, with a first layer of CP-1216 at a coating weight of 0.8 mg/dm$^2$ and a second layer of 76RES P546 at a coating weight of 70 mg/dm$^2$.

The components of the photosensitive composition were fed into a 30 mm twin screw extruder which performed the functions of melting, mixing, deaerating and filtering the composition. The material was extruded at 135° C. through a die into the rotating bank of a two-roll calender, and then calendered between the support film and the cover layer.

The element formed during calendering had a total thickness of 0.072 in (1.83 mm) and was cut into samples of 18 in (46 cm) lengths.

Example 3

This example illustrates the formation of a flexographic printing plate from the photosensitive element from example 2.

A sample of the calendered material was placed in a CYREL® 3040 Exposure Unit (E. I. du Pont de Nemours and Company, Wilmington, Del.) and given an overall exposure in air through the support film for 60 seconds. The polyethylene terephthalate coversheet was then stripped off, leaving the HEC/HPC layer adhered to the photosensitive layer. The HEC/HPC layer provided a smooth, non-tacky surface on which the image-bearing transparency was placed. The photosensitive layer was then exposed for 90 seconds under vacuum through the transparency in the same exposure unit.

After exposure, the transparency was removed and the exposed element was placed in a rotary drum-brush type CYREL® 3038W Processor. The HEC/HPC layer and the unexposed regions of the photopolymer layer were removed by brushing in tap water at 46° C. for 8 minutes. The developed element was placed in a forced hot air drier at 60° C. for 15 minutes, and then post-exposed and light-finished for 3 minutes in a CYREL® Finisher/Post-Expose Unit. The finished plate had a relief of 0.040 in (1.02 mm), a Shore A hardness of 60 (measured with a Zwick Duramatic 7207), and a resilience of 35 (measured with a Zwick 5109 Rebound Resilience Tester).

The plate was then mounted in a Mark Andy 830 printing press with 0.020 in (0.051 mm) foam tape (3M CUSHION-MOUNT® Plus #1120). Transfer of EC 9630 aqueous black ink from a UCARLOX® laser engraved ceramic anilox roll to Fasson High Gloss Face Stock at 100 ft/min (50.8 cm/sec) was judged to be equivalent to that from a commercial CYREL® Type 67 PLS+ plate in both density and uniformity.

Examples 4–10

The following examples illustrate the use of different basic components.

The following photosensitive compositions were prepared using the components listed below, in parts by weight:

|  | Example | | | | | | |
|---|---|---|---|---|---|---|---|
| Component | 4 | 5 | 6 | 7 | 8 | 9 | 10 |
| Micragel | 88.2 | 73.2 | 73.2 | 78.2 | 78.2 | 88.2 | 88.2 |
| HMDA | 10.0 | 5.0 | 5.0 | 5.0 | 10.0 | 5.0 | 5.0 |
| HMDMA | — | — | — | — | — | 5.0 | 5.0 |
| NLA | — | 5.0 | 5.0 | 5.0 | — | — | — |
| TBP | — | 5.0 | 5.0 | — | — | — | — |
| Initiator | 1.2 | 1.2 | 1.2 | 1.2 | 1.2 | 1.2 | 1.2 |
| BHT | 0.5 | 0.5 | 0.5 | 0.5 | 0.5 | 0.5 | 0.5 |
| Inhibitor | 0.1 | 0.1 | 0.1 | 0.1 | 0.1 | 0.1 | 0.1 |
| Base 1 | — | 10.0 | — | — | — | — | — |
| Base 2 | — | — | 10.0 | — | — | — | — |
| Base 3 | — | — | — | 10.0 | — | — | — |
| Base 4 | — | — | — | — | 10.0 | — | — |
| Base 5 | — | — | — | — | — | 26.8 | — |
| Base 6 | — | — | — | — | — | — | 37.6 |

Each photosensitive composition was mixed on a two-roll mill at 110° C. for 15 minutes. The mixed compositions were placed between a support sheet and a coversheet (as described in Example 2) and then placed in a hydraulic press at 120° C. and pressed out to from a sample with a total thickness of 0.072 in (1.83 mm).

Development rate in water was determined for unexposed samples by removing the coversheet and processing in a Miraclon CP-A4 orbital brush processor using tap water at 46° C. The results are provided in the table below.

Plate swelling in aqueous inks was determined by the following procedure: 1×2 inch (2.5×5.1 cm) samples were cut from the unexposed plate. These were exposed through the support for 30 seconds and through the coverlayer for 8 minutes, using the exposure unit described in Example 3. The coversheet was removed and the samples were processed for 5 minutes in the brush processor using tap water at 46° C., dried for 60 minutes at 60° C., and then light finished and post-exposed for 10 minutes. The finished samples were weighed, and then soaked for 24 hours with stirring in a simulated aqueous ink consisting of a solution of 80% water and 20% n-propanol (by volume) in which the pH had been adjusted to 9.0 with triethanolamine. The samples were then blotted dry and weighed again. The plate swelling was determined as the percent weight gain. The results are given in the table below.

|  | Example | | | | | | |
|---|---|---|---|---|---|---|---|
|  | 4 | 5 | 6 | 7 | 8 | 9 | 10 |
| Dev. Rate |  |  |  |  |  |  |  |
| mils/min: | 0 | 10 | 8 | 9 | 3 | 5 | 6 |
| mm/min: | 0 | 0.25 | 0.20 | 0.23 | 0.08 | 0.13 | 0.15 |
| Swelling % | 2.6 | 1.5 | 5.5 | 21.4 | 20.0 | 19.4 | 12.3 |

Example 4 could not be developed in tap water. However, it could be developed in basic aqueous solutions, such as 10% NaOH in water, and the developed plate had good resistance to swelling. Examples 5 and 6 had good water developability and resistance to swelling. Examples 7–10 had poorer resistance to swelling.

Examples 11–18

These examples illustrate the use of different microgel binders.

The binders were prepared as described in Example 1 except that the acidic comonomer was added at different stages of the butadiene core polymerization and different types and levels of acidic comonomer were added. The differences are given in the table below.

Finished flexographic plates were made using the formulation and conditions described in Example 5. The hardness and resilience were measured as described in Example 3. The results are given in the table below.

| Example | BD[a] | Acid level[b] | Acid | Resilience | Durometer |
|---|---|---|---|---|---|
| 11 | 85 | 8 | AA | 47 | 56 |
| 12 | 85 | 8 | MAA | 52 | 64 |
| 13 | 85 | 5 | AA | 53 | 53 |
| 14 | 85 | 5 | MAA | 48 | 60 |
| 15 | 65 | 8 | AA | 25 | 60 |
| 16 | 65 | 8 | MAA | 24 | 66 |
| 17 | 65 | 5 | AA | 32 | 52 |
| 18 | 65 | 5 | MAA | 27 | 61 |

[a]degree of BD polymerization when the acidic comonomer was added
[b]% acid by weight based on the weight of the butadiene These results show that (i) using a microgel binder with acrylic acid produced plates having a lower durometer than those in which the microgel binder has methacrylic acid, (ii) using the acidic monomer at a 5% level resulted in lower durometer than at the 8% level, and (iii) adding the acidic comonomer when the butadiene polymerization was 85% complete produced plates with greater resilience.

What is claimed is:
1. A photosensitive element comprising a support and a photosensitive layer, said photosensitive layer comprising:
   (a) an elastomeric microgel binder having a core comprising a homopolymer or copolymer of an elastomeric monomer and a shell comprising a copolymer of the elastomeric monomer and a monomer having acidic functionality, wherein the shell copolymer is formed by polymerizing the monomer having acidic functionality with unpolymerized elastomeric monomer from the core;
   (b) at least one ethylenically unsaturated monomer or oligomer; and
   (c) a photoinitiator system.

2. The photosensitive element of claim 1 which further comprises
   (d) a basic compound capable of neutralizing the acidic functionality.

3. The photosensitive element of claim 2 wherein the basic compound comprises a basic nitrogen-containing compound having at least one ethylenically unsaturated group.

4. The photosensitive element of claim 3 wherein the basic compound contains (i) an amino group and (ii) an ethylenically unsaturated group selected from the group consisting of acrylate, methacrylate, acrylamide, methacrylamide, acryloylcarbamate, and methacryloylcarbamate.

5. The photosensitive element of claim 4 wherein the basic compound is selected from the group consisting of diethylaminoethyl acrylate, diethylaminoethyl methacrylate, dimethylaminopropyl acrylamide, dimethylaminopropyl methacrylamide, and mixtures thereof.

6. The photosensitive element of claim 1 wherein the photosensitive layer comprises, based on the total weight of the photosensitive layer:
   (a) 40–95% by weight microgel binder;
   (b) 5–30% by weight monomer; and
   (c) 0.1–5.0% by weight photoinitiator system.

7. The photosensitive element of claim 6 which further comprises:
   (d) 1–15% by weight of a basic compound capable of neutralizing the acidic functionality.

8. The photosensitive element of claim 1 which further comprises a coversheet over the photosensitive layer.

9. The photosensitive element of claim 1 wherein a macromolecular polymeric binder is present in combination with the elastomeric microgel binder.

10. The photosensitive element of claim 9 wherein the macromolecular polymeric binder is selected from the group consisting of acid-containing polymers or their salts and amphoteric polymers.

11. The photosensitive element of claim 1 wherein the elastomeric microgel binder core comprises an elastomer selected from the group consisting of poly(butadiene), poly(isoprene), poly(butadiene-styrene), poly(isoprene-styrene), neoprene, polyurethanes and mixtures thereof.

12. The photosensitive element of claim 11 wherein the elastomeric microgel binder has a core comprising a copolymer of butadiene and styrene and a shell comprising a copolymer of butadiene and a monomer having acidic functionality.

13. The photosensitive element of claim 1 wherein the monomer having acidic functionality is selected from the group consisting of acrylic acid and methacrylic acid.

14. The photosensitive element of claim 13 wherein the elastomeric microgel binder has a core comprising a copolymer of butadiene and styrene and a shell comprising a copolymer selected from the group consisting of butadiene/acrylic acid and butadiene/methacrylic acid.

15. A process for preparing a flexographic printing plate comprising:
   (a) imagewise exposing to actinic radiation a photosensitive element comprising a support and a photosensitive layer, said photosensitive layer comprising:
      (i) an elastomeric microgel binder having a core comprising a homopolymer or copolymer of an elastomeric monomer and a shell comprising a copolymer of the elastomeric monomer and a monomer having acidic functionality, wherein the shell copolymer is formed by polymerizing the monomer having acidic functionality with unpolymerized elastomeric monomer from the core;
      (ii) at least one ethylenically unsaturated monomer or oligomer; and
      (iii) a photoinitiator system;
   (b) removing the unexposed areas of the photosensitive layer by washing with an aqueous solution;
   (c) optionally applying a post-development treatment selected from the group consisting of drying, post-exposing to actinic radiation, light finishing, and combinations thereof.

16. The process of claim 15 in which the photosensitive layer further comprises:
   (d) a basic compound capable of neutralizing the acidic functionality.

17. The process of claim 15 wherein the aqueous solution is water.

* * * * *